United States Patent
Schweitzer, III et al.

(10) Patent No.: US 11,031,812 B1
(45) Date of Patent: Jun. 8, 2021

(54) ELECTRIC FIELD POWERED DEVICES IN ELECTRIC POWER SYSTEMS

(71) Applicant: Schweitzer Engineering Laboratories, Inc., Pullman, WA (US)

(72) Inventors: Edmund O. Schweitzer, III, Pullman, WA (US); Joe Baylon, Pullman, WA (US); Timothy M. Minteer, Pullman, WA (US); David Kenny, Pullman, WA (US); James Mobley, Moscow, ID (US); Johnny J. Moore, Moscow, ID (US); Raymond W. Rice, Pullman, WA (US); Naiden K. Spasov, Spokane, WA (US); Eric M. Sawyer, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/144,283

(22) Filed: Jan. 8, 2021

(51) Int. Cl.
*H02J 13/00* (2006.01)
*G01R 31/40* (2020.01)

(52) U.S. Cl.
CPC ........ *H02J 13/00002* (2020.01); *G01R 31/40* (2013.01); *H02J 13/00016* (2020.01)

(58) Field of Classification Search
CPC .......... H02J 13/00002; H02J 13/00016; G01R 31/40
USPC .................................... 324/764.01, 537, 500
See application file for complete search history.

(56) References Cited

U.S. PATENT DOCUMENTS

| | | | | |
|---|---|---|---|---|
| 4,975,629 A | * | 12/1990 | Callahan | H02M 5/293 323/235 |
| 5,226,509 A | * | 7/1993 | Smith | F16D 66/02 116/208 |
| 7,003,912 B1 | * | 2/2006 | Morgan | A01K 87/007 43/16 |
| 8,650,411 B2 | | 2/2014 | Feight | |
| 10,333,312 B2 | * | 6/2019 | Zweigle | H02J 3/24 |
| 10,848,092 B2 | * | 11/2020 | Donolo | G01R 31/343 |
| 10,938,198 B2 | * | 3/2021 | Kasztenny | G01R 19/2513 |

OTHER PUBLICATIONS

Guo, Feng, Hayat, Hassan, and Wang, Jin: "Energy Harvesting Devices for High Voltage Transmission Line Monitoring" 2011.
Lee, S.; Kim, D.; Jin, Y.; Han, Y.; Desta, Y.; Bryant, M.D.; Goettert, J.; "A Micro corona motor fabricated by a SU-8 built on X-ray mask" Microsystem Technologies, 10, 2004.

\* cited by examiner

*Primary Examiner* — Giovanni Astacio-Oquendo
(74) *Attorney, Agent, or Firm* — Jared L. Cherry

(57) ABSTRACT

The present disclosure relates to powering distributed sensors used to monitor electrical and/or environmental conditions and to powering other equipment associated with electric power systems. In one embodiment, a system may be used to mount a sensor in proximity to a reference conductor. An electric field power conversion subsystem may generate a usable electric potential from an electric field created by the electric power system and existing between the reference conductor and another conductor (e.g., another phase conductor, a ground conductor). The sensor powered by the usable electric potential may provide a measurement of a condition associated with the electric power system. A communication subsystem powered by the usable electric potential may communicate the measurement of the condition to a monitoring system.

21 Claims, 10 Drawing Sheets

- - - Voltage at Node 524
—— Voltage Across Bulk Capacitor 506
—·— Inductor 516 Current —— Voltage at Node 524
- - - Voltage at Node 512
—·— Inductor 516 Current

ELECTRIC FIELD POWERED DEVICES IN ELECTRIC POWER SYSTEMS

TECHNICAL FIELD

The present disclosure pertains to powering line sensors using electric fields in proximity to electric power lines. More particularly, but not exclusively, the present disclosure pertains to devices that generate power from electric fields emanating from the electric power lines on which or in proximity to which such devices are installed. Such devices may be used, in connection with other equipment, to monitor, automate, and/or protect the electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
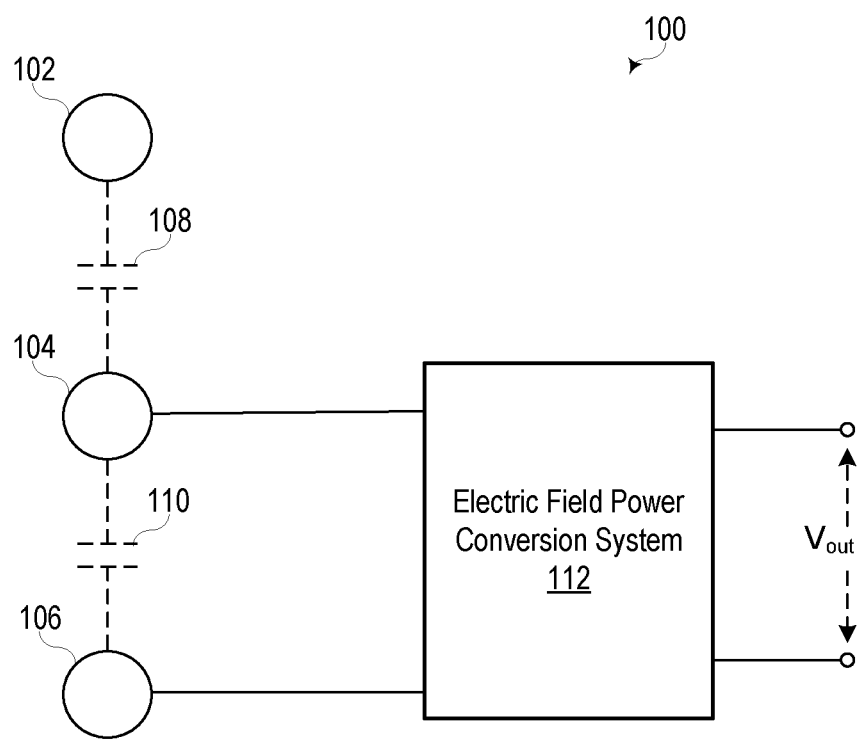
FIG. 1 illustrates a conceptual representation of an electric field power conversion system to convert electric fields emanating from a reference conductor in an electric power to a usable output voltage consistent with embodiments of the present disclosure.

Electric power systems are used to generate, transmit, and distribute electric power to loads, and serve as an important part of critical infrastructure. Electric power systems and equipment may be monitored and protected by a variety of types of equipment. Protection relays may analyze the parameters of an electric power system to implement protective functions. The primary protective relays may communicate with various other supervisory devices such as automation systems, monitoring systems, supervisory (SCADA) systems, and other intelligent electronic devices (IEDs). IEDs may collect data from various devices within an electric power system and monitor, control, automate, and/or protect such devices.

Sensors distributed throughout an electric power system may be used to perform various tasks. For example, faulted circuit indicators (FCI) may include electrostatic power systems capable of gathering small amounts of power (e.g., about 10 microwatts) that is stored in capacitors to trip or reset a visual indicator on current conditions of an electric power line on which the FCI is mounted. The amount of power generated by an FCIs is too small to power electronics that acquire voltage or current samples and to power communications systems to transmit this data. Other power sources include solar or wind generators; however, these sources are intermittent and may require batteries to operate reliability. Further, inclusion of batteries in distributed sensors may increase the maintenance associated with such devices because batteries degrade over time.

Existing distributed sensor systems may also rely on physical connections, which may be resistive or capacitive, between one electric power conductor and an adjacent phase or ground. Such systems are more complex to install and maintain in comparison to devices that are not resistively or capacitively connected between phases or between one phase and ground.

The inventors of the present disclosure have recognized improved techniques disclosed herein for powering devices using electric fields emanating from conductors in electric power systems. Systems and methods disclosed herein may provide sufficient power to operate electronics for generating and communicating measurements of electrical parameters. Further, such systems may operate on conductors with minimal or no current flow, without the need for sun or wind, and without batteries. Such systems may also physically couple exclusively to one electrical conductor, without the need for physical connections between phases or between one phase and ground, thus simplifying installation of such systems.

Systems and methods consistent with the present disclosure may generate power from electric fields emanating from electric conductors for sensors that monitor electrical parameters, such as current and voltage, or other conditions (e.g., environmental conditions, integrity of electric power system devices, etc.). Various types of systems may be used to convert energy from the electric fields to useable energy, including a thermoelectric device, an electrostatic motor, and/or a switch mode power supply.

Sensors consistent with the present disclosure may be used to generate electrical parameter measurements that may be used in a wide range of applications such as fault current magnitude, fault direction, and high impedance fault detection, etc. Such data may be provided to a variety of equipment used to automate, monitor, and protect the power system, such as protective relays, IEDs, control systems, etc.

As used herein, an IED may refer to any microprocessor-based device that monitors, controls, automates, and/or protects monitored equipment within a system. Such devices may include, for example, differential relays, distance relays, directional relays, feeder relays, overcurrent relays, voltage regulator controls, voltage relays, breaker failure relays, generator relays, motor relays, remote terminal units, automation controllers, bay controllers, meters, recloser controls, communication processors, computing platforms, programmable logic controllers (PLCs), programmable automation controllers, input and output modules, and the like. The term IED may be used to describe an individual IED or a system comprising multiple IEDs. Further, IEDs may include sensors (e.g., voltage transformers, current transformers, contact sensors, status sensors, light sensors, tension sensors, etc.) that obtain information about the electric power system.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. A module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

FIG. 1 illustrates a conceptual representation of an electric field power conversion system 100 to convert electric fields emanating from a reference conductor in an electric power to a usable output voltage consistent with embodiments of the present disclosure. An electric field power conversion system 112 is mounted to the reference conductor 106. A peripheral conductor 102 (or multiple conductors depending on the system) may be an adjacent phase conductor (e.g., conductors in a three-phase system) and/or any ground conductors, grounded structures, or the earth ground.

An electric field node conductor 104 may be a part of a system that converts energy from an electric field emanating from a conductor in an electric power system to a usable power source. The electric field node conductor 104 may be disposed in proximity to reference conductor 106. The electric field node conductor 104 may have any shape, size, composition, location, and design. For example, spherical or toroidal surfaces may increase capacitance and/or decrease corona discharge. Electric field node conductor 104 may maximize a parasitic capacitance 108 between the electric field node conductor 104 and the peripheral conductor 102, while minimizing a parasitic capacitance 110 between the electric field node conductor 104 and the reference conductor 106. The parasitic capacitances 108 and 110 are illustrated in dashed lines because the capacitances are not physical connections. In various embodiments, the reference conductor 106 could also be a ground conductor, grounded structure, or earth ground and the peripherical conductor 102 may comprise one or more electric power phase conductors.

Electric field power conversion system 112 is electrically attached to the electric field node conductor 104 and reference conductor 106. Electric field power conversion system 112 converts the electric field power emanating from reference conductor 106 to a usable electric potential, $V_{out}$. In various embodiments, the voltage output may be less than 100 Volts and may be referenced to the electronic circuitry ground.

The usable electric potential generated by electric field power conversion system 112 may be used to power a variety of devices, such as voltage sensors, current sensors, fallen conductor sensors, environmental sensors, and the like. Further, the power generated by electric field power conversion system 112 may power a communication system to transmit measurements generated by such sensors. Electric field power conversion system 112 may generate sufficient power for both a sensor and a communication system. In various embodiments, the power generated by electric field power conversion system 112 is on the order of tens of milliwatts. Other embodiments may generate more power.

The usable voltage output (i.e., $V_{out}$ with respect to electronic circuitry ground) may be unregulated. The output may be a direct current with a ripple or an alternating current (at any frequency, fixed or variable, with any harmonic content). Additional circuitry (e.g., a voltage regulator) may be included to condition the output for specific applications.

In some embodiments, the "ground" value of the usable electric potential generated by the electric field power conversion system 112 may equal (or approximately equal) the potential of the reference conductor 106. In such embodiments, the electric field power conversion system 112 may comprise an isolated supply to allow the reference conductor 106 to serve as the "ground" value of the output.

Electric field power conversion system 112 may comprise a variety of energy conversion devices to generate a useful electrical output from the electric fields emanating from reference conductor 106. In some embodiments, a resistive device may be in 112 and placed across nodes 104 and 106, and a thermoelectric device may convert the heat to a useable voltage at $V_{out}$. The thermoelectric device may provide a stable output that can be used to power a variety of devices for various applications. Thermoelectric devices may be solid-state devices that operate reliably for long periods of time and in severe environments without maintenance.

In other embodiments, an electrostatic motor (e.g., a corona motor) may be in 112 and placed across nodes 104 and 106 that produces mechanical energy. The mechanical energy from the electrostatic motor may be converted to electric energy with an electric generator. The output of the generator $V_{out}$ may be either alternating current or direct current depending on the application. Electrostatic motors may tolerate high input voltages and may allow for use of systems consistent with the present disclosure on high-voltage applications, such as high-voltage electric transmission lines.

In still other embodiments a switch mode power supply may be in 112 and the input of the power supply placed across nodes 104 and 106 and the output of the power supply generating $V_{out}$. The switch mode power supply may be embodied in a variety of ways, including without limitation: a semiconductor (e.g., an insulated-gate bipolar transistor (IGBT) or a metal oxide silicon field effect transistor (MOSFET)), a spark gap, a non-isolated buck converter, an isolated flyback converter, and an isolated forward converter. Several of these switch mode power supplies are discussed in greater detail below.

In various embodiments, a mounting system may be used to mount electric field power conversion system 100 to reference conductor 106. The mounting system may include physical connections to secure electric field power conversion system 112. Further, the mounting system may allow electric field node conductor 104 to be mount to reference conductor 106.

Figure 2:
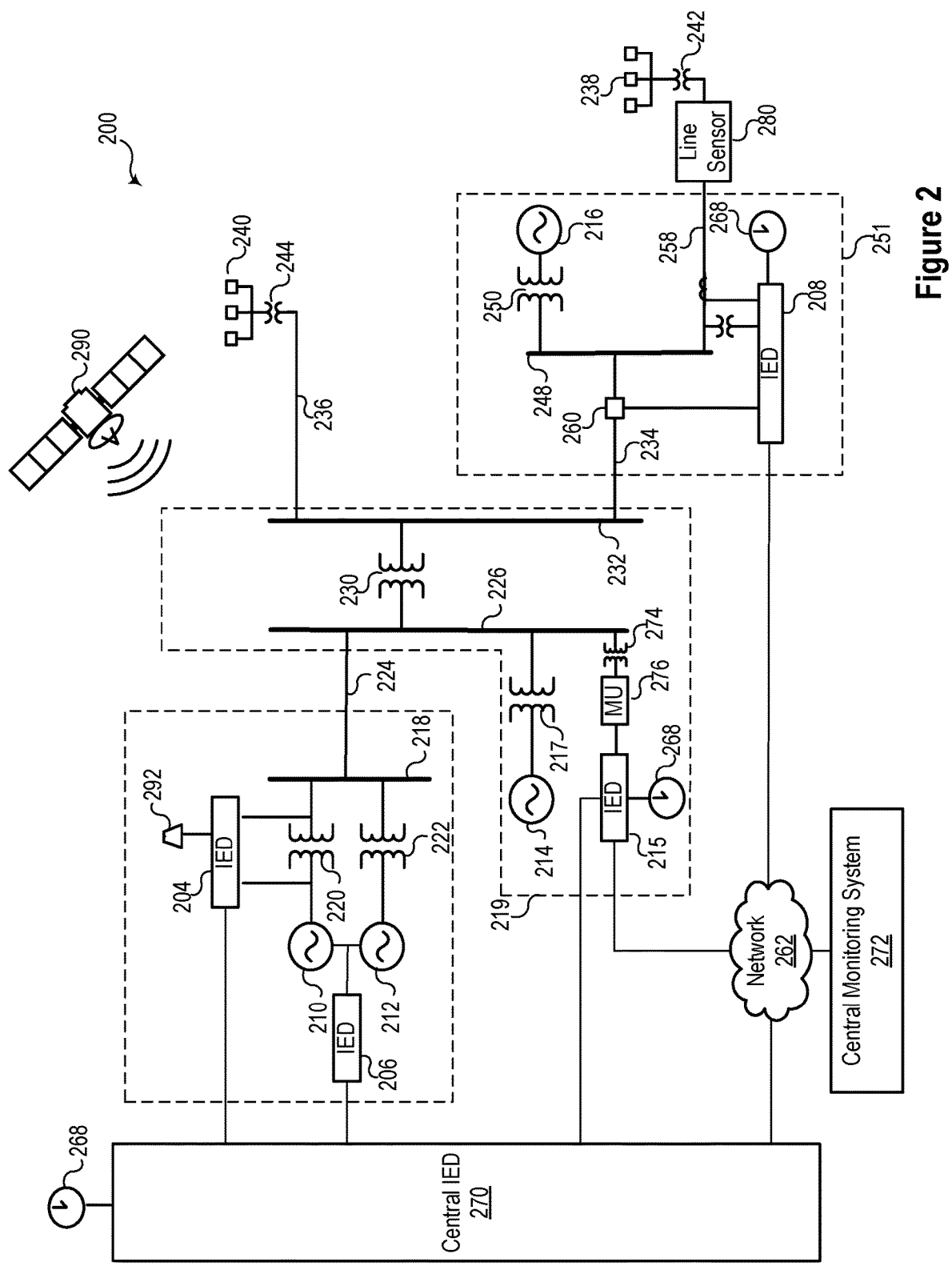
FIG. 2 illustrates a simplified one-line diagram of an electric power delivery system including an electric power conversion system consistent with embodiments of the present disclosure.

FIG. 2 illustrates a simplified one-line diagram of an electric power delivery system 200 including an electric power conversion system consistent with embodiments of the present disclosure. Electric power delivery system 200 may be configured to generate, transmit, and distribute electric energy to loads. Electric power delivery systems may include equipment such as electrical generators (e.g., generators 210, 212, 214, and 216), transformers (e.g., transformers 217, 220, 222, 230, 242, 244, 250, and 274), power transmission and delivery lines (e.g., lines 224, 234, 236, and 258), circuit breakers (e.g., breaker 260), busses (e.g., busses 218, 226, 232, and 248), loads (e.g., loads 240 and 238) and the like. A variety of other types of equipment may also be included in electric power delivery system 200, such as voltage regulators, capacitor banks, and the like.

Substation 219 may include a generator 214, which may be a distributed generator, and which may be connected to bus 226 through step-up transformer 217. Bus 226 may be connected to a distribution bus 232 via a step-down transformer 230. Various distribution lines 236 and 234 may be connected to distribution bus 232. Load 240 may be fed from distribution line 236. Further, step-down transformer 244 in communication with distribution bus 232 via distribution line 236 may be used to step down a voltage for consumption by load 240.

Distribution line 234 may lead to substation 251 and deliver electric power to bus 248. Bus 248 may also receive electric power from distributed generator 216 via transformer 250. Distribution line 258 may deliver electric power from bus 248 to load 238 and may include further step-down transformer 242. Circuit breaker 260 may be used to selectively connect bus 248 to distribution line 234. IED 208 may be used to monitor and/or control circuit breaker 260 as well as distribution line 258.

Electric power delivery system 200 may be monitored, controlled, automated, and/or protected using IEDs, such as IEDs 204, 206, 208, 215, and 270, and a central monitoring system 272. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

Central monitoring system 272 may comprise one or more of a variety of types of systems. For example, central monitoring system 272 may include a supervisory control and data acquisition (SCADA) system and/or a wide area control and situational awareness (WACSA) system. A central IED 270 may be in communication with IEDs 204, 206, 208, and 215. IEDs 204, 206, 208, and 215 may be remote from the central IED 270 and may communicate over various media such as a direct communication from IED 206 or over a wide-area communications network 262. According to various embodiments, certain IEDs may be in direct communication with other IEDs (e.g., IED 204 is in direct communication with central IED 270) or may be in communication via a communication network 262 (e.g., IED 208 is in communication with central IED 270 via communication network 262).

A common time signal 268 may be used to time-align measurements for comparison and/or synchronize action across system 200. Utilizing a common or universal time source may allow for the generation of time-synchronized data, such as synchrophasors. In various embodiments, the common time source may comprise a time signal from a GNSS system 290. IED 204 may include a receiver 292 configured to receive the time signal 268 from the GNSS system 290. In various embodiments, IED 206 may be configured to distribute the time signal 268 to other components in system 200, such as IEDs 204, 208, 215, and 270.

A voltage transformer 274 may be in communication with a merging unit (MU) 276. MU 276 may provide information from voltage transformer 274 to IED 215 in a format useable by IED 215. MU 276 may be placed near to voltage transformer 274 and may digitize discrete input/output (I/O) signals and analog data, such as voltage measurements. These data may then be streamed to IED 215. In various embodiments, MU 276 may be located outside of a substation enclosure or control house, thus increasing safety by removing high-energy cables from areas where personnel typically work. In various embodiments, MU 276 may be embodied as an SEL-2240 available from Schweitzer Engineering Laboratories of Pullman, Wash.

A variety of sensors, such as sensor 280, may be distributed throughout system 200 to obtain information regarding electrical conditions used for automation, monitoring, and protection. Sensor 280 may track the frequency of alternating current through transmission line 258 to determine a data sampling period and obtain a specified number of samples per cycle. The sampled data may be provided to IED 208 or another device for use in a variety of applications, such as determining a fault current magnitude, determining a fault direction, and detecting a high impedance fault, etc.

Figure 3A:
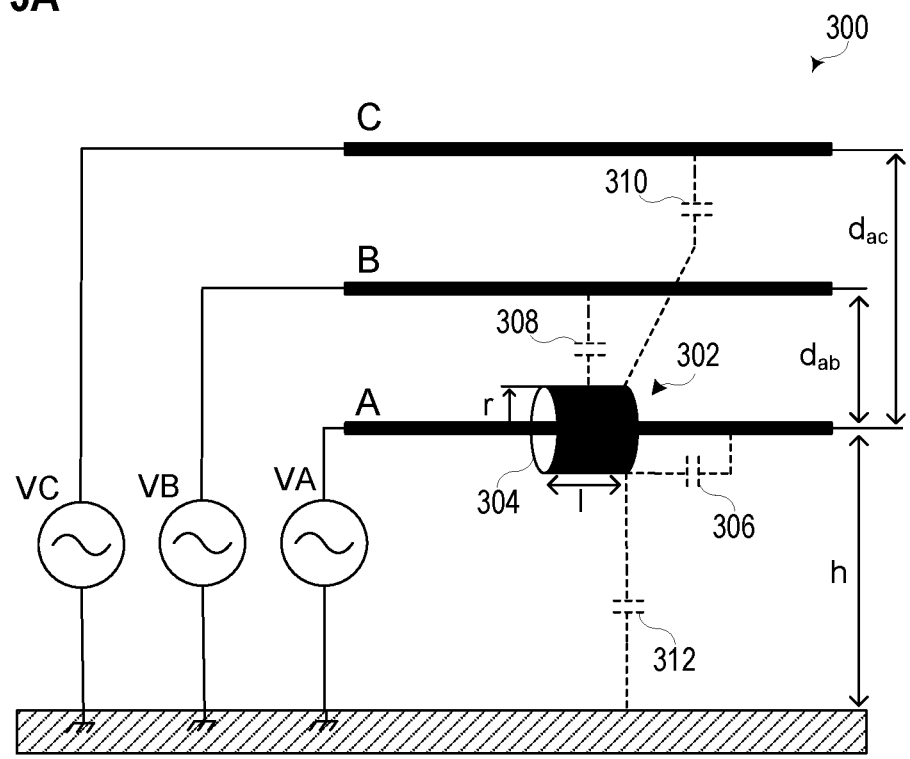
FIG. 3A illustrates a representation of a system including an electric field power conversion system device consistent with embodiments of the present disclosure.

FIG. 3A illustrates a conceptual representation of a system 300 including an electric field power conversion system 302 device consistent with embodiments of the present disclosure. System 300 comprises a three-phase power system that includes three power sources (VA, VB, and VC), each of which is out of phase by 120°. The three power sources are connected to respective conductors (A, B and C). The electric field power conversion system 302 is mounted to conductor A. As one of skill in the art will appreciate, the conceptual representation illustrated in FIG. 3A is intended to reflect an abstraction of various concepts disclosed herein rather than details of a specific implementation.

In the illustrated embodiment, electric field power conversion system 302 includes a cylinder 304 with length l and radius r surrounding a portion of conductor A. In other embodiments, other designs may be used. Parasitic capacitances between the cylinder 304 and each phase are shown using dashed lines. The parasitic capacitance between the cylinder 304 and Earth or ground 312 is also shown. The value of the capacitance 306 between the cylinder 304 and phase A is influenced by the radius (r) and length (l) of the cylinder 304. The value of the capacitance 308 between the cylinder 304 and phase B is influenced by the distance between conductor A and conductor B (dab) and the surface parameters of 304. The value of the capacitance 310 between the cylinder 304 and phase C is influenced by the distance between conductor A and conductor C (dac) and the surface parameters of 304. Finally, the value of the capacitance 312 between the cylinder 304 and ground is influenced by the height (h) of conductor A above the ground and the surface parameters of 304.

Figure 3B:
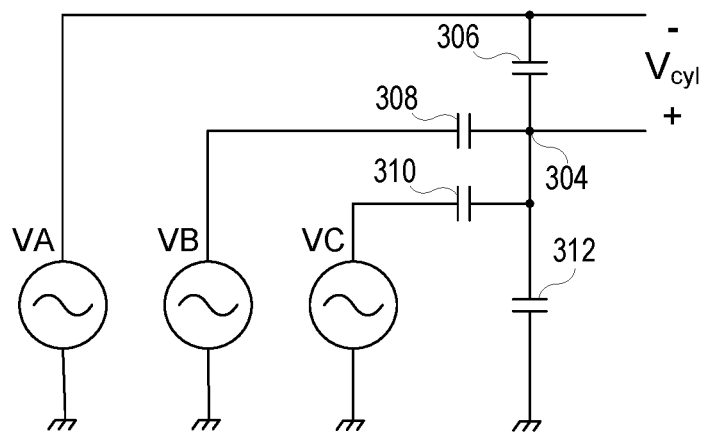
FIG. 3B illustrates a circuit equivalent for the system illustrated in FIG. 3A consistent with embodiments of the present disclosure.

FIG. 3B illustrates a circuit equivalent for the system illustrated in FIG. 3A consistent with embodiments of the present disclosure. The electric field from conductor A creates a voltage, $V_{cyl}$, across capacitor 306. As such, electric field power conversion system 302 of FIG. 3A may be designed to minimize the value of capacitor 306 while maximizing the other capacitances. A usable electric potential may be developed between node 304 (i.e., cylinder 304 in FIG. 3A) and the reference conductor (i.e., conductor A in FIG. 3A). Various designs, materials, and configurations of the device may be used in various embodiments.

Figure 3C:
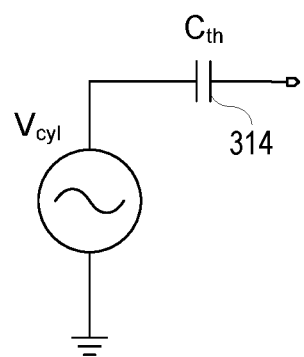
FIG. 3C illustrates a Thevenin equivalent for the circuit illustrated in FIG. 3B consistent with embodiments of the present disclosure.

FIG. 3C illustrates a Thevenin equivalent for the circuit illustrated in FIG. 3B consistent with embodiments of the present disclosure. Power transfer from conductor A to the electric field power conversion system 302 of FIG. 3A is maximized when the input impedance of electric field power conversion system 302 approximately matches the Thevenin impedance of the conductors. The Thevenin equivalent capacitance $C_{th}$, 314 is based on the values of capacitors 306, 308, 310, and 312. The Thevenin equivalent source is the voltage across the capacitor $V_{cyl}$.

Figure 3D:
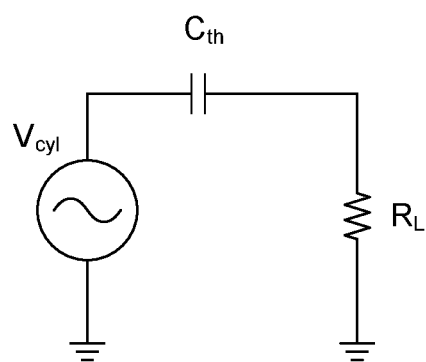
FIG. 3D illustrates the Thevenin equivalent circuit of FIG. 3C with a matched resistance, $R_L$, consistent with embodiments of the present disclosure.

FIG. 3D illustrates the Thevenin equivalent circuit of FIG. 3C with a matched resistance, RL, consistent with embodiments of the present disclosure. The optimum power transfer occurs when the load, RL, matches the capacitive reactance of the of the Thevenin capacitance, $C_{Th}$, 314 of FIG. 3C. The available power to the load, RL, is proportional to the square of the line-to-line voltage. The optimal value of the load, RL, can be calculated using Eq. 1.

$$R_L = \frac{1}{2\pi f_{in} * C_{th}} \qquad \text{Eq. 1}$$

The impedance for systems consistent with the present disclosure may be in the range of 10s of megaohms to 100s of megaohms. Matching this high impedance is one of the challenges for implementing an electric field power conversion system. Although optimum power transfer occurs when the load matches the input impedance, some mismatch may still allow for satisfactory performance. Accordingly, various systems consistent with the present disclosure may seek to approximately match the impedance within two orders of magnitude.

In various embodiments, the load, RL, may comprise a variety of devices. In some embodiments, the load, RL, comprises sensors and electronics used to monitor conditions associated with an electric power system (e.g., electrical parameters, environmental conditions, equipment status, etc.). In other embodiments, the load, RL, comprises circuitry that ultimately drives sensors and electronics. Such circuitry may include, for example, a resistive element that generates heat used by a thermo electric device to generate electrical energy. Further, the circuitry may include a generator that converts the output voltage to mechanical energy and a generator to convert the mechanical energy to electrical energy.

Figure 4:
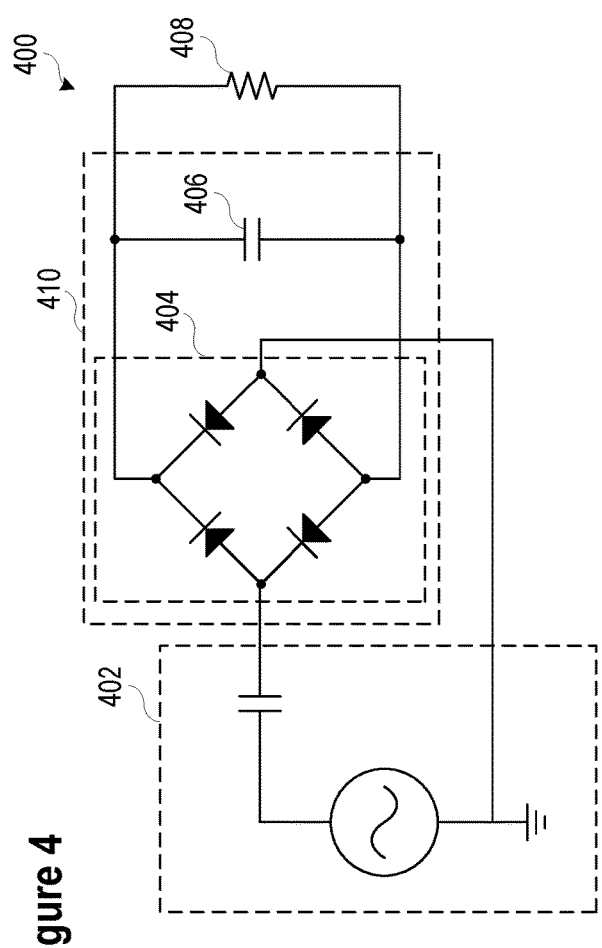
FIG. 4 illustrates a circuit comprising a Thevenin equivalent of an electric field power conversion system, a full bridge rectifier, a bulk capacitor, and a load consistent with embodiments of the present disclosure.

FIG. 4 illustrates a circuit 400 comprising a Thevenin equivalent 402 of an electric power system and electric field power conversion system 410 consistent with embodiments the present disclosure. Electric power conversion system 410 includes a full bridge rectifier 404 and a bulk capacitor 406. Operation of diodes in the full bridge rectifier 404 converts alternating current provided by a source to a direct current. In some embodiments, a half-bridge rectifier may be used; however, is such embodiments, the available power available to provide to load 408 would be reduced. Capacitor 406 may smooth the voltage output from full bridge rectifier 404. The smoothed output of the electric power conversion system 410 may be a useable electric power source that provides power to a load 408. In various embodiments, load 408 may represent a variety of devices (e.g., electric parameter sensors, environmental sensors, communication devices, etc.) powered by an electric field power conversion system consistent with the present disclosure.

Figure 5A:
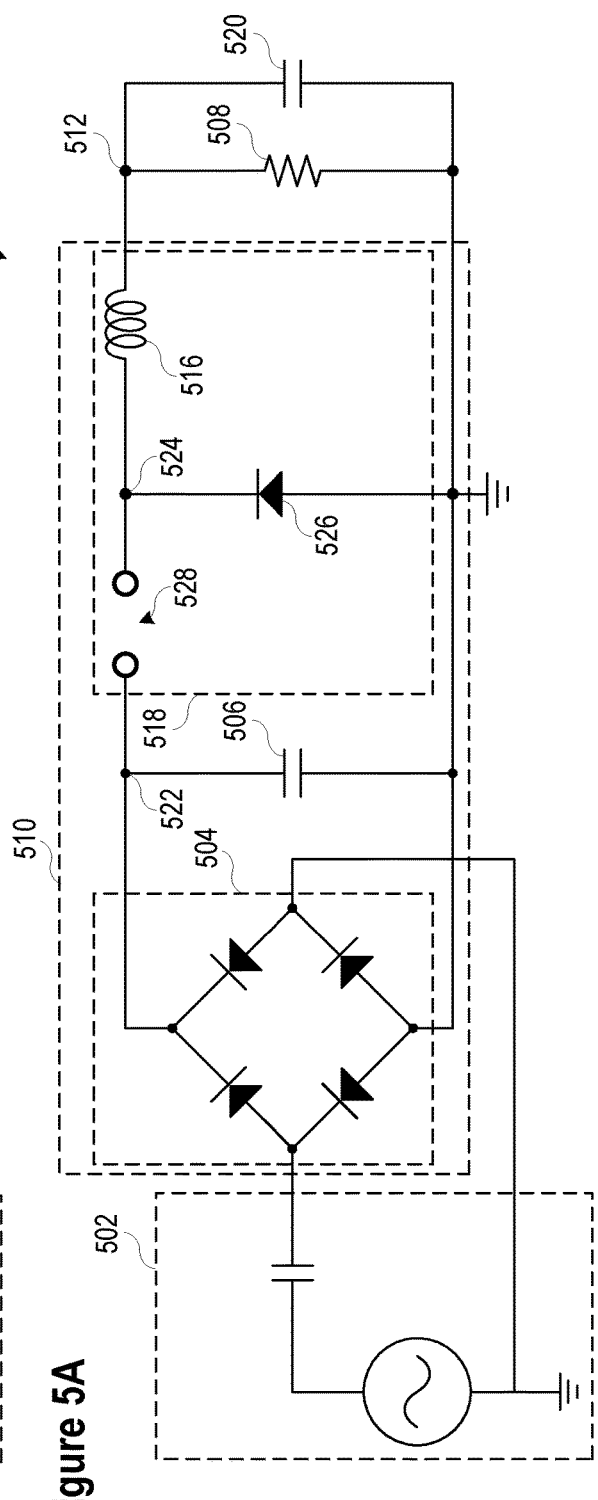
FIG. 5A illustrates a circuit comprising a Thevenin equivalent of an electric field power conversion system, a full bridge rectifier, a bulk capacitor, a switch mode power supply, and a load consistent with embodiments of the present disclosure.

FIG. 5A illustrates a circuit 500 comprising a Thevenin equivalent 502 of an electric power system and an electric field power conversion system consistent with embodiments of the present disclosure. In the illustrated embodiment, electric power conversion system 510 includes a full bridge rectifier 504, a bulk capacitor 506, and a switch mode power supply 518. Switch mode power supply 518 comprises a spark gap 528. Charge builds across bulk capacitor 506 until the voltage exceeds a breakdown threshold across the spark gap 528. The spark transfers electrical energy to inductor 516.

Figure 5B:
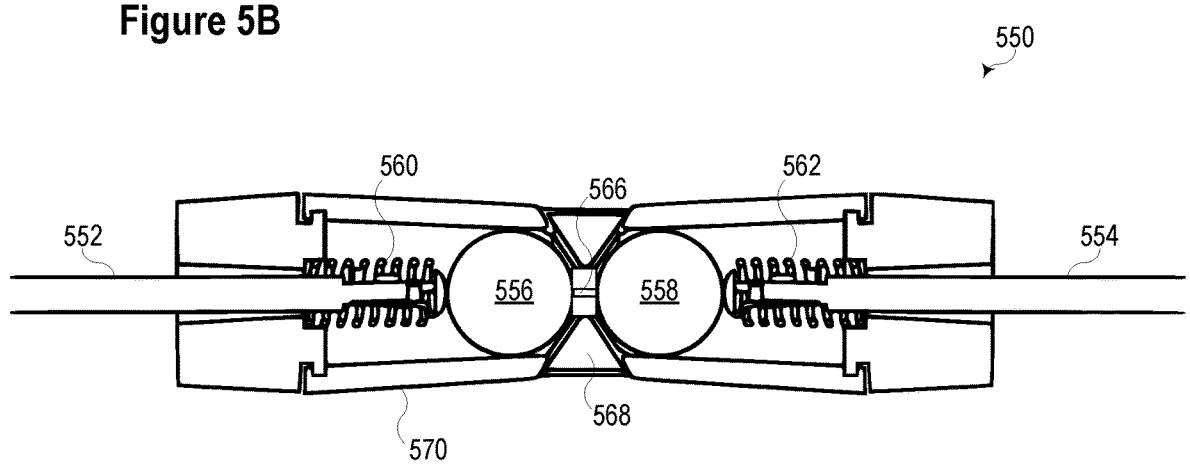
FIG. 5B illustrates one embodiment of a spark gap device consistent with embodiments of the present disclosure.

FIG. 5B illustrates one embodiment of a spark gap device 550 consistent with embodiments of the present disclosure. The device may comprise a housing 570 that contains a plurality of components. A pair of conductors 552 and 554 may enter the housing 570 and may be connected to circuit 500 at nodes 522 and 524 (shown in FIG. 5A), respectively. Contact between the conductors 552 and 554 and a pair of conductive spheres 556 and 558 may be maintained by springs 560 and 562, respectively. An insulator 568 may be disposed between the conductive spheres 556 and 558. A spark gap 566 may allow an electrical arc to transmit electrical energy between the conductive spheres 556 and 558 when the voltage difference exceeds a breakdown voltage.

Figure 5C:
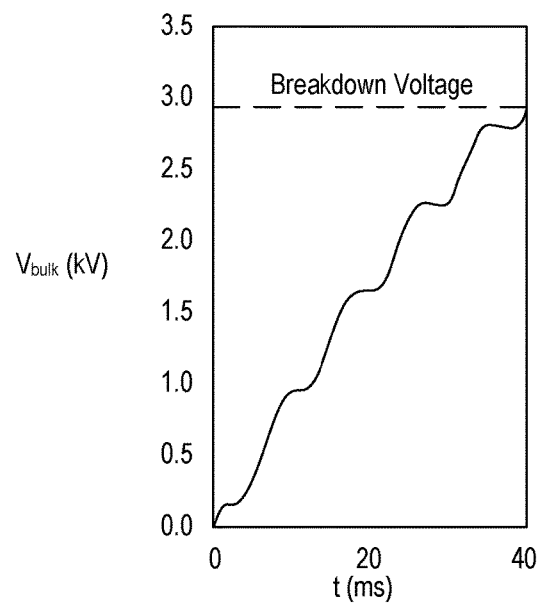
FIG. 5C illustrates a plot over time of a voltage across a bulk capacitor in FIG. 5A consistent with embodiments of the present disclosure.

FIG. 5C illustrates a plot over time of a voltage across a bulk capacitor 506 in FIG. 5A consistent with embodiments of the present disclosure. As shown, the voltage increases over time until it reaches the breakdown voltage of spark gap 528. The increasing voltage stores energy in the bulk capacitor that is discharged by an arc across spark gap 528.

Figure 5D:
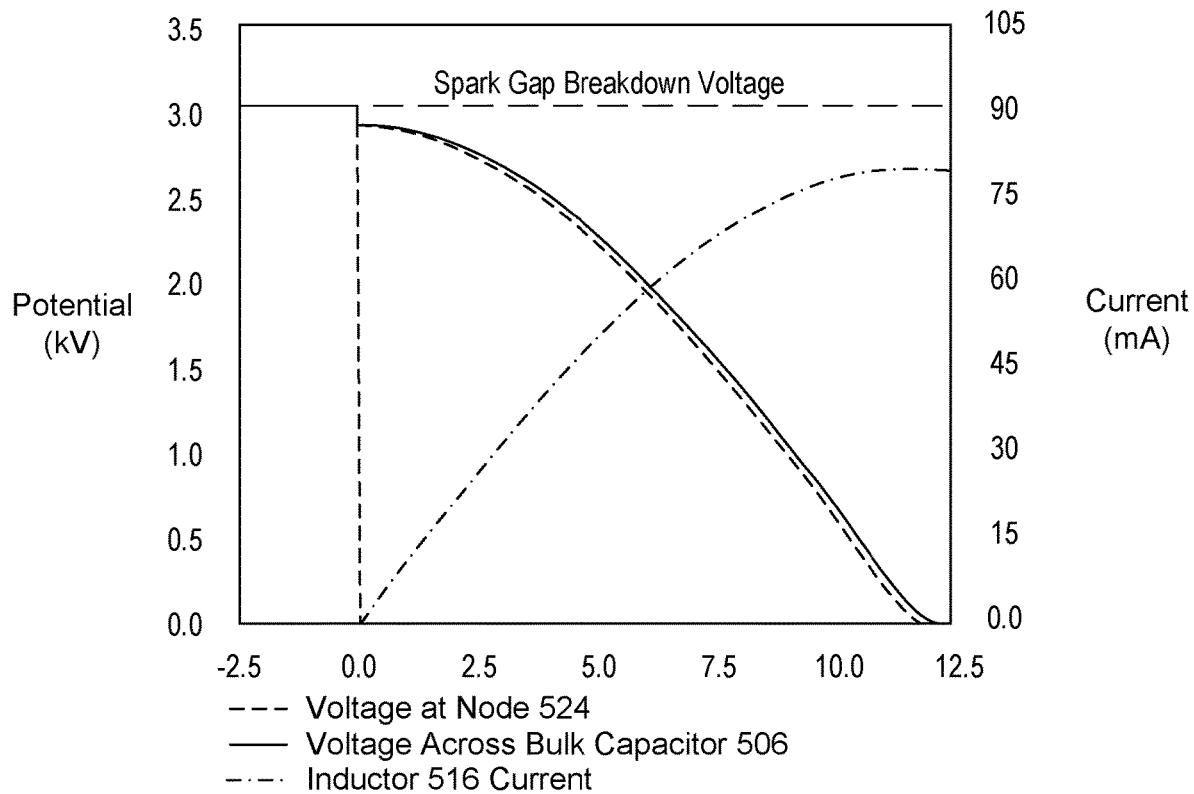
FIG. 5D illustrates a plot of voltage across the bulk capacitor and a current through an inductor while an electric arc exists across the spark gap and consistent with embodiments of the present disclosure.

FIG. 5D illustrates a plot of the voltage across bulk capacitor 506 (shown in FIG. 5A) and the current through inductor 516 while an electric arc exists across spark gap 528, consistent with embodiments of the present disclosure. As may be appreciated, when the voltage across bulk capacitor 506 is below the breakdown voltage, there is no energy transfer across the spark gap 528. Any voltage at node 512 is maintained by the output capacitance 520. As energy is collected from the input power supply (i.e., a line-mounted electric field energy conversion device), the voltage increases toward the breakdown voltage.

Once the voltage across bulk capacitor 506 reaches the breakdown voltage of the spark gap 528, an electric arc forms across the spark gap 528. The charge in the bulk capacitor 506 redistributes with the parasitic capacitance of the diode 526 and parasitic capacitance of the inductor 516. While the arc continues, the remaining energy in these capacitances transfers to the inductor and the output load 508. Over time, the current in the inductor begins to flow through diode 526 and the arc in the spark gap 528 extinguishes. The inductor current continues to decrease until all the energy that was stored in the inductor is transferred to the output load (RL and CL).

Figure 5E:
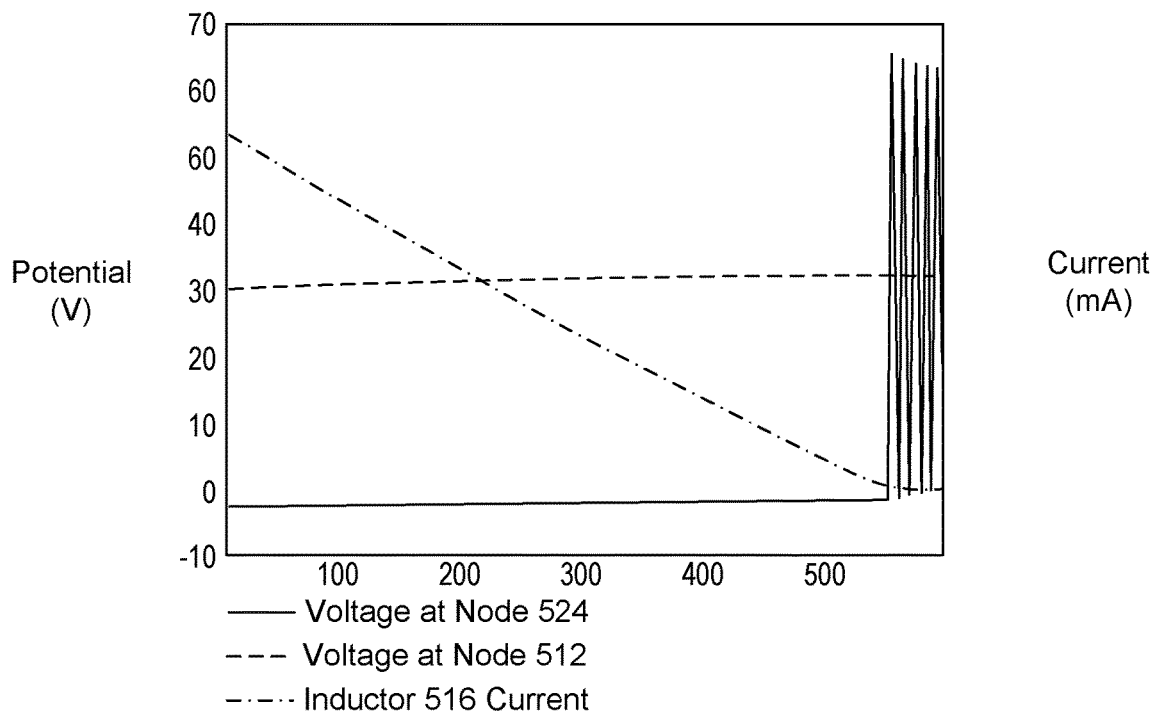
FIG. 5E illustrates a plot of the voltage across the bulk capacitor, the output voltage at a node, and current through the inductor over time consistent with embodiments of the present disclosure.

FIG. 5E illustrates a plot of the voltage across bulk capacitor 506, the output voltage at node 512, and current through inductor 516 over time consistent with embodiments of the present disclosure. The current in the inductor 516 ramps down to zero as the energy in the inductor transfers to the output load. The output voltage remains relatively constant at approximately 30 $V_{dc}$. Once the energy in inductor 516 ramps down to zero, the voltage at node 524 exhibits the typical ringing that occurs at the beginning of the discontinuous mode for a buck converter.

The values of circuit components may be selected based on particular applications. For example, if the value of bulk capacitor 506 is too low, an appreciable loss of energy may occur; however, if the value is too high, the energy efficiency is reduced as energy transfers from the Thevenin capacitance to the bulk capacitance. Further, the ratio of the forward voltage drop of diode 526 and the output voltage impacts the efficiency of the buck converter if the diode voltage drop is a significant fraction of the output voltage.

Embodiments may also be optimized for use at different voltages that typically exist at different segments in an electric power system. For example, embodiments used in high-voltage applications (e.g., high-voltage transmission lines) may utilize different components in comparison to embodiments used in lower-voltage applications. Corona motors may be well-suited to high-voltage applications, where other energy conversion devices, such as a spark gap converter, may not be well suited for high voltages, both due to component limitations.

Figure 6:
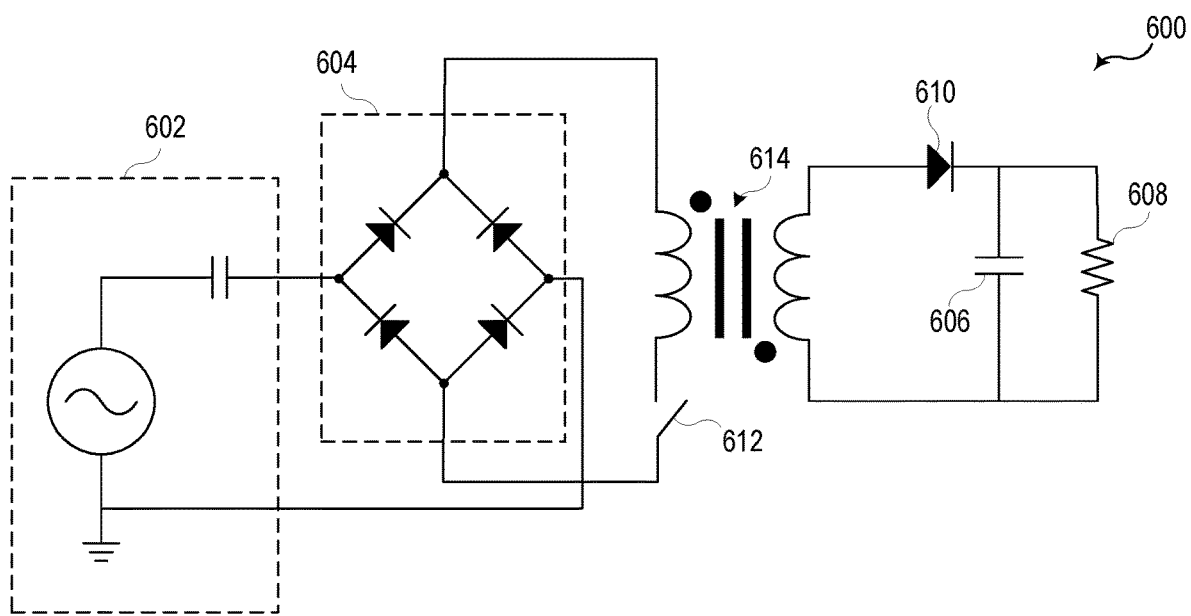
FIG. 6 illustrates a circuit diagram of a flyback converter that may provide power for use by a distributed sensor consistent with embodiments of the present disclosure.

FIG. 6 illustrates a circuit diagram of a flyback converter 600 that may provide power for use by a distributed sensor consistent with embodiments of the present disclosure. A Thevenin equivalent 602 of an electric field power conversion system may provide power to a full bridge rectifier 604 and to flyback converter 600. In operation, a switch 612 may close to connect the primary of a transformer 614 to the input voltage source. The primary current and magnetic flux in the transformer 614 increases and stores energy. The voltage induced in a secondary winding is negative, which reverse biases the diode 610. The reverse bias prevents current flow, which leaves an output capacitor 606 to provide power to a load 608.

When switch 612 is opened, the primary current and magnetic flux in transformer 614 drops, resulting in a positive secondary voltage. The positive secondary voltage allows current to flow from the transformer 614 through diode 610. The energy from the transformer 614 recharges output capacitor 606 and provides power to load 608.

In various embodiments, switch 612 may be implemented using a spark gap or a semiconductor switching device. In some embodiments, the semiconductor switching device may comprise an IGBT or a MOSFET. In other embodiments, switch 612 may be embodied as a spark gap. As one of skill in the art will appreciate, semiconductor switching devices may also be used in other types of devices that provide power for use by a line-mounted sensor consistent with embodiments of the present disclosure.

Figure 7:
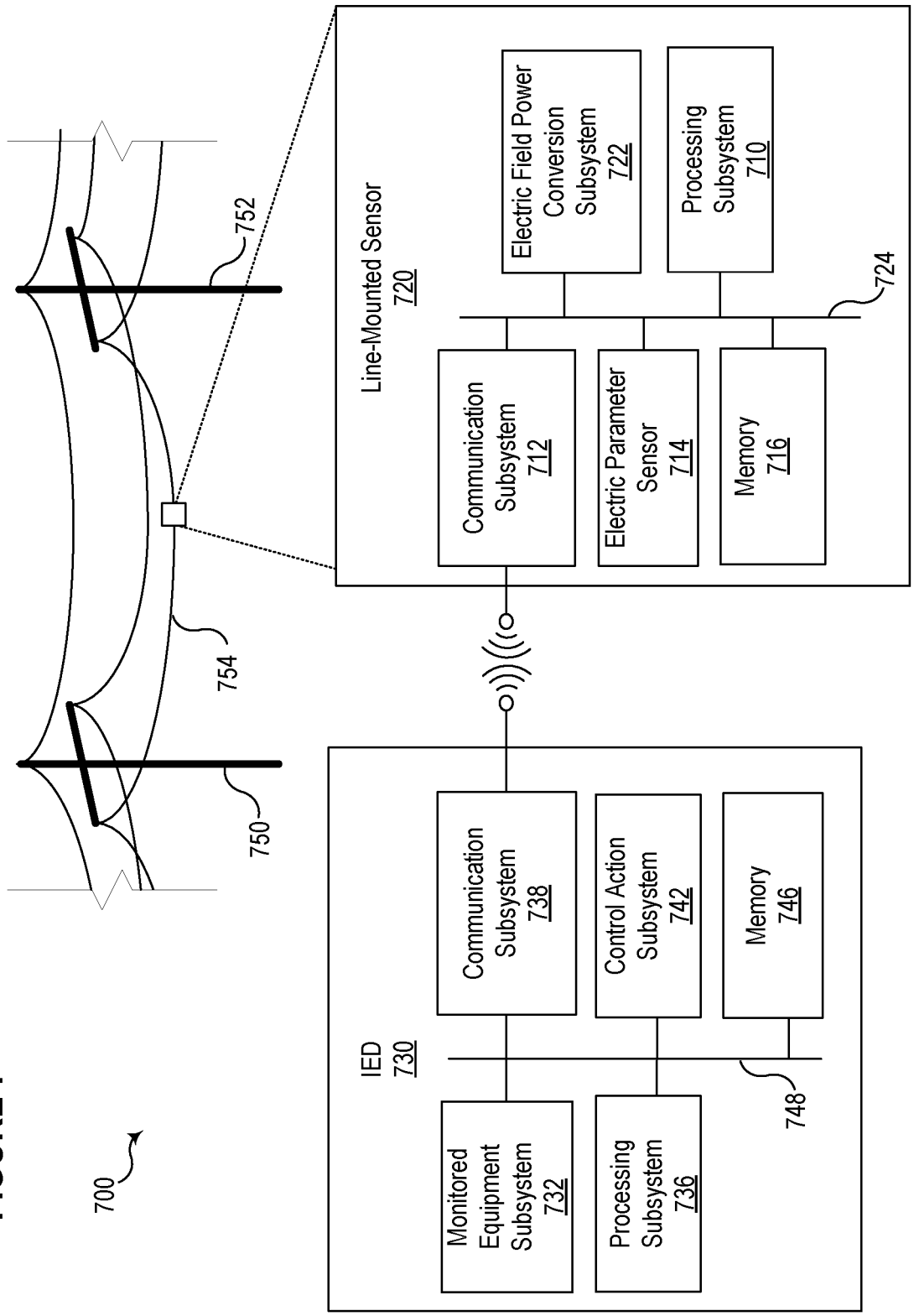
FIG. 7 illustrates a functional block diagram of a system to monitor electrical parameters in an electric power system using a distributed sensor powered by an electric field power conversion subsystem consistent with embodiments of the present disclosure.

FIG. 7 illustrates a functional block diagram of a system 700 to monitor electrical parameters in an electric power system using a line-mounted sensor powered by an electric field power conversion subsystem 722 consistent with embodiments of the present disclosure. System 700 may be implemented using hardware, software, firmware, and/or any combination thereof. The specifically illustrated configuration is merely representative of one embodiment consistent with the present disclosure.

Line-mounted sensor 720 is mounted to conductor 754, which is suspended between pylons 750, 752. Only a single line-mounted wireless sensor 720 is illustrated. In other embodiments, multiple line-mounted sensors may be used. Additional line-mounted sensors may be disposed at other locations or mounted to other conductors. Conductor 754 may comprise a high-voltage transmission line or a medium-voltage distribution line.

Line-mounted sensor 720 and IED 730 each contain various subsystems represented by functional blocks. The functional blocks in line-mounted sensor 720 may communicate using data bus 724, and the functional blocks in IED 730 may communicate using data bus 748. Although the illustrated embodiment comprises a line-mounted sensor 720, in other embodiments a line mounted device may include a environmental sensors, communication devices (e.g., repeaters), and the like.

A wireless communication subsystem 712 may be configured to communicate information, such as measurements obtained by line-mounted sensor 720, to IED 730. Communication subsystem 712 may utilize various technologies to enable wireless communication. Such communication may include radio frequency communications and may employ analog or digital modulation techniques and protocols.

Communication subsystem 712 may enable transmission of data from line-mounted sensor 720 related to electrical parameters associated with conductor 754. In some embodiments, communication subsystem 712 may enable bi-directional communication between line-mounted sensor 720 and IED 730, while in other embodiments, communication may be unidirectional.

An electric parameter sensor 714 may measure electric parameters associated with electric energy in conductor 754. Electric parameter sensor 714 may comprise a voltage sensor, a current sensor, or any other type of device to monitor an aspect of electrical energy in conductor 754.

An electric field power conversion subsystem 722 may convert power emanating from conductor 754 to a usable electric output. Electric field power conversion subsystem 722 may further incorporate a power storage device that may be used to transmit information when current is not flowing through conductor 754 and power cannot be generated from electric fields. A power storage device may be embodied as a battery, a supercapacitor, and the like.

A memory 716 may include computer system readable media in the form of volatile memory, such as random-access memory (RAM) and/or cache memory. The memory 716 may further include other removable/non-removable, volatile/non-volatile computer system storage media. In various embodiments, the memory 716 may include at least one program product having a set of program modules that are configured to carry out the functions described herein.

A processing subsystem 710 may be configured to process information received from other functional blocks in line-mounted sensor 720. Processing subsystem 710 may operate using any number of processing rates and architectures. Processing subsystem 710 may be configured to perform various algorithms and calculations described herein. Processing subsystem 710 may be embodied as a general-purpose integrated circuit, an application-specific integrated circuit, a field-programmable gate array, and/or any other suitable programmable logic device.

Turning now to the functional blocks associated with IED 730, a monitored equipment subsystem 732 may be in communication with monitored equipment that is operable to control an aspect or a portion of an electric power system. The monitored equipment subsystem 732 may be configured to issue commands to and/or receive status information from monitored equipment. In certain embodiments, monitored equipment subsystem 732 may be in communication with, for example, a circuit breaker and may issue commands to the circuit breaker to selectively connect or disconnect portions of the electric power system.

Memory 746 may include computer system readable media in the form of volatile memory, such as random-access memory (RAM) and/or cache memory. The memory 746 may further include other removable/non-removable, volatile/non-volatile computer system storage media. In various embodiments, the memory 746 may include at least one program product having a set of program modules.

Processing subsystem 736 may be configured to perform various algorithms and calculations described herein. In various embodiments, processing subsystem 736 may be embodied as a general-purpose integrated circuit, an application-specific integrated circuit, a field-programmable gate array, and/or any other suitable programmable logic device.

Communication subsystem 738 may receive information from and/or send information to line-mounted sensor 720. Communication subsystem 738 may be compatible with communication subsystem 712, utilizing the same communication technology and communication protocol(s). In various embodiments, IED 730 may also comprise other communication interfaces (e.g., a wired communication interface) to communicate with other devices, such as other IEDs, a SCADA system, etc.

A control action subsystem 742 may implement control actions based on information received from line-mounted sensor 720 and other electrical parameters associated with electric energy in conductor 754. In some embodiments, control action subsystem 742 may control a circuit breaker, which may be selectively activated and deactivated based on electrical conditions. Control action subsystem 742 may issue commands to selectively connect and disconnect portions of an electric power system using monitored equipment subsystem 732.

Figure 8:
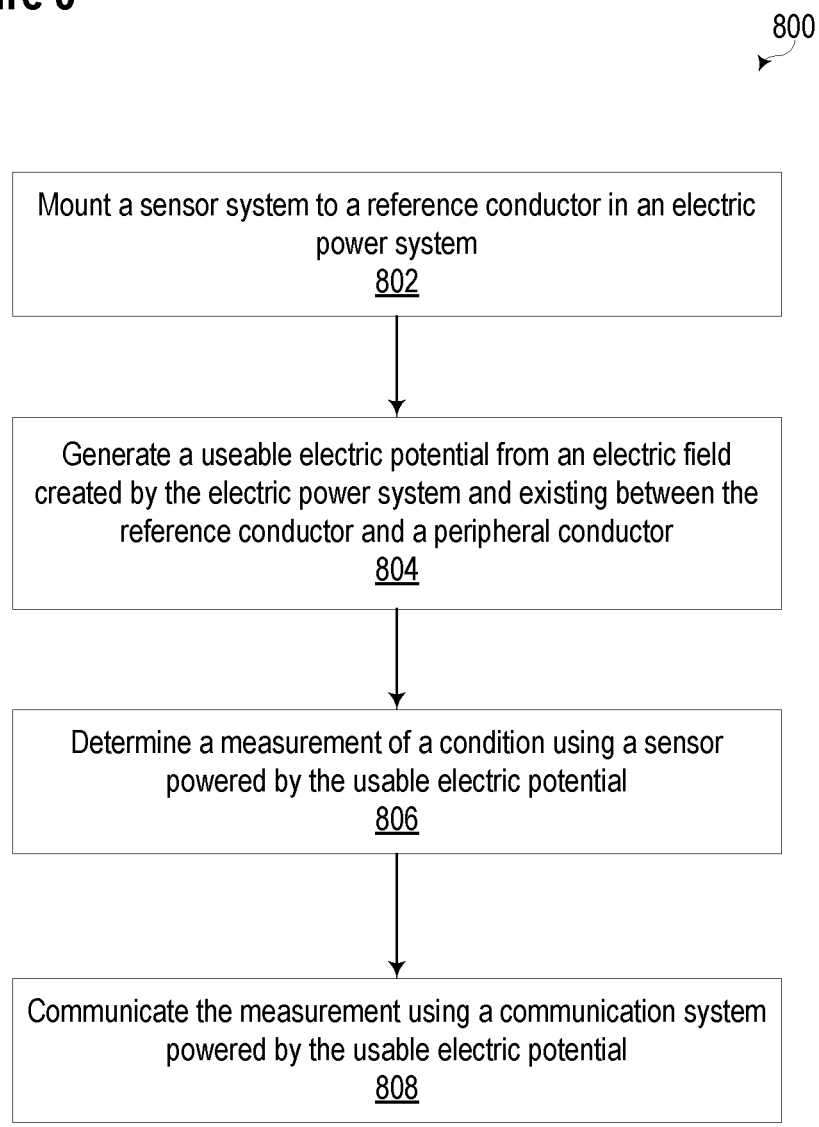
FIG. 8 illustrates a flowchart of a method of collecting and using information from a system to monitor a condition affecting an electric power system.

FIG. 8 illustrates a flowchart of a method 800 of collecting and using information from a system to monitor a condition affecting an electric power system. At 802, a sensor may be mounted to a reference conductor in an electric power system. The sensor may be configured to monitor electrical parameters (e.g., voltage, current, etc.), environmental conditions (temperature, humidity, wind, etc.), and/or conditions of the electric power system (e.g., equipment status, etc.).

At 804, a useable electric potential may be generated from an electric field created by the electric power system and existing between the reference conductor and a peripheral conductor. In some embodiments, the reference conductor may be one phase of a multi-phase power system, and the peripheral conductor may be another phase. Alternatively, the peripheral conductor may comprise a ground or neutral conductor.

At 806, a sensor powered by the usable electric potential between the reference conductor and the peripheral conductor may determine a measurement of a condition. In some embodiments, the measurement of the condition may be used to monitor, automate, and/or protect the electric power system. For example, the sensor may be embodied as a current sensor, and upon detection of an over-current condition, an IED or protective relay may actuate a breaker to interrupt the flow of current.

At 808, a measurement generated by the sensor may be communicated using a communication system powered by the usable electric potential. In some embodiments, the communication system may allow for wireless transmission of measurements. Such systems may facilitate installation of sensors without the need for physical connections to wired communication systems.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to monitor a condition associated with an electric power system, comprising:
   a mounting system to mount the system in proximity to a reference conductor in the electric power system;
   an electric field power conversion subsystem to generate a usable electric potential from an electric field created by the electric power system and existing between the reference conductor and at least one peripheral conductor;
   a sensor powered by the usable electric potential between the reference conductor and the at least one peripheral conductor and configured to obtain a measurement of the condition associated with the electric power system; and
   a communication subsystem powered by the usable electric potential between the reference conductor and the at least one peripheral conductor and to communicate the measurement of the condition associated with the electric power system;
   wherein the system is configured to physically connect exclusively to the reference conductor.

2. The system of claim 1, wherein an impedance of the electric field power conversion subsystem is configured to match an equivalent impedance of the electric power system within one order of magnitude.

3. The system of claim 1, wherein a ground value of the usable electric potential is approximately equal to a potential of the reference conductor.

4. The system of claim 1, wherein the mounting system is configured:
   to minimize a first parasitic capacitance between the reference conductor and an electric field node conductor; and
   to maximize a second parasitic capacitance between the electric field node conductor and the at least one peripheral conductor.

5. The system of claim 4, wherein the electric field node conductor comprises an approximately cylindrical conductor disposed around the reference conductor.

6. The system of claim 1, wherein the electric field power conversion subsystem further comprises:
   a resistive element to generate heat from the usable electric potential; and
   a thermoelectric device to convert the heat to an electrical output to power the sensor and the communication subsystem.

7. The system of claim 1, wherein the electric field power conversion subsystem further comprises:
   an electrostatic motor to convert the usable electric potential to mechanical energy; and
   a generator to convert the mechanical energy to an electrical output to power the sensor and the communication subsystem.

8. The system of claim 7, wherein the reference conductor comprises a high-voltage electric transmission line in the electric power system.

9. The system of claim 1, wherein the electric field power conversion subsystem further comprises a switch mode power supply.

10. The system of claim 9, wherein the switch mode power supply comprises a spark gap.

11. The system of claim 9, wherein the switch mode power supply comprises an isolated flyback converter.

12. The system of claim 1, wherein the sensor is configured to monitor at least one of an environmental condition and an electrical condition.

13. The system of claim 1, wherein the at least one peripheral conductor comprises one of a phase conductor or ground.

14. The system of claim 1, wherein the electric field power conversion subsystem is configured to generate at least 10 milliwatts of power.

15. The system of claim 1, wherein the mounting system is configured to mount the system to the reference conductor.

16. A method of monitoring a condition associated with an electric power system, comprising:
   mounting, using a mounting system, a system in proximity to a reference conductor in the electric power system;
   generating, using an electric field power conversion subsystem, a usable electric potential from an electric field created by the electric power system and existing between the reference conductor and at least one peripheral conductor;
   sensing, using a sensor powered by the usable electric potential between the reference conductor and the at least one peripheral conductor, a measurement of the condition associated with the electric power system; and
   communicating, using a communication subsystem powered by the usable electric potential between the reference conductor and the at least one peripheral conductor, the measurement of the condition associated with the electric power system;
   wherein the system is configured to physically connect exclusively to the reference conductor.

17. The method of claim 16, further comprising matching an impedance of the electric field power conversion subsystem to an equivalent impedance of the electric power system within two orders of magnitude.

18. The method of claim 16, wherein a ground value of the usable electric potential is approximately equal to a potential of the reference conductor.

19. The method of claim 16, further comprising:
   minimizing, using the mounting system, a first parasitic capacitance between the reference conductor and an electric field node conductor; and
   maximizing, using the mounting system, a second parasitic capacitance between the electric field node conductor and the at least one peripheral conductor.

20. The method of claim 16, further comprising:
   generating heat, using a resistive element, from the usable electric potential; and
   converting the heat, using a thermoelectric device, to an electrical output to power the sensor and the communication subsystem.

21. The method of claim 16, wherein the electric field power conversion subsystem further comprises a switch mode power supply.

* * * * *